(12) United States Patent
Pillarisetty et al.

(10) Patent No.: US 11,869,890 B2
(45) Date of Patent: Jan. 9, 2024

(54) STACKED TRANSISTORS WITH CONTACT LAST

(71) Applicant: Intel Corporation, Santa Clara, CA (US)

(72) Inventors: Ravi Pillarisetty, Portland, OR (US); Willy Rachmady, Beaverton, OR (US); Gilbert Dewey, Beaverton, OR (US); Rishabh Mehandru, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 93 days.

(21) Appl. No.: 16/651,233

(22) PCT Filed: Dec. 26, 2017

(86) PCT No.: PCT/US2017/068441
§ 371 (c)(1),
(2) Date: Mar. 26, 2020

(87) PCT Pub. No.: WO2019/132863
PCT Pub. Date: Jul. 4, 2019

(65) Prior Publication Data
US 2021/0384191 A1 Dec. 9, 2021

(51) Int. Cl.
*H01L 27/092* (2006.01)
*H01L 21/768* (2006.01)
(Continued)

(52) U.S. Cl.
CPC ...... *H01L 27/092* (2013.01); *H01L 21/76898* (2013.01); *H01L 21/8221* (2013.01);
(Continued)

(58) Field of Classification Search
CPC .......... H01L 21/76898; H01L 21/8221; H01L 21/823871; H01L 23/485; H01L 27/092; H01L 27/0688
See application file for complete search history.

(56) References Cited

U.S. PATENT DOCUMENTS 4,939,568 A * 7/1990 Kato ................. H01L 25/50
257/686
5,355,022 A 10/1994 Sugahara et al.
(Continued)

FOREIGN PATENT DOCUMENTS

CN 1309077 C 4/2007
CN 105448998 3/2016
(Continued)

OTHER PUBLICATIONS

International Preliminary Report on Patentability from PCT/US2017/068441 dated Jul. 9, 2020, 11 pgs.
(Continued)

*Primary Examiner* — Herve-Louis Y Assouman
(74) *Attorney, Agent, or Firm* — Essential Patents Group, LLP

(57) ABSTRACT

An apparatus is provided which comprises: a first transistor comprising a source region and a drain region with a channel region therebetween, a first dielectric layer over the first transistor, a second transistor comprising a source region and a drain region with a channel region therebetween, wherein the second transistor is over the first dielectric layer, a second dielectric layer over the second transistor, and a contact coupled to the source region or the drain region of the first transistor, wherein the contact comprises a metal having a straight sidewall that extends from through both the first and second dielectric layers. Other embodiments are also disclosed and claimed.

14 Claims, 8 Drawing Sheets

(51) Int. Cl.
*H01L 21/822* (2006.01)
*H01L 23/485* (2006.01)
*H01L 27/06* (2006.01)
*H01L 21/8234* (2006.01)
*H01L 27/088* (2006.01)
*H01L 21/8238* (2006.01)

(52) U.S. Cl.
CPC .... *H01L 21/823871* (2013.01); *H01L 23/485* (2013.01); *H01L 27/0688* (2013.01)

(56) References Cited

U.S. PATENT DOCUMENTS

| | | |
|---|---|---|
| 5,869,867 A | 2/1999 | Takeuchi |
| 6,424,020 B1 | 7/2002 | Vu et al. |
| 6,455,398 B1 | 9/2002 | Fonstad et al. |
| 6,605,951 B1 | 8/2003 | Cowan |
| 6,627,953 B1 | 9/2003 | Vu et al. |
| 7,091,534 B2 | 8/2006 | Koyanagi |
| 7,095,068 B2 | 8/2006 | Kumura et al. |
| 7,402,866 B2 | 7/2008 | Liang et al. |
| 7,479,673 B2 | 1/2009 | Jang et al. |
| 7,825,472 B2 | 11/2010 | Park et al. |
| 7,947,540 B2 | 5/2011 | Lee |
| 8,018,008 B2 | 9/2011 | Ozoe |
| 8,084,795 B2 | 12/2011 | Pan |
| 8,354,675 B2 | 1/2013 | Kwon et al. |
| 8,395,191 B2 | 3/2013 | Or-Bach et al. |
| 8,426,888 B2 | 4/2013 | Molin |
| 9,129,926 B2 | 9/2015 | Koo et al. |
| 9,171,887 B2 | 10/2015 | Yokoyama |
| 9,184,136 B2 | 11/2015 | Kim et al. |
| 9,305,834 B1 | 4/2016 | Latypov et al. |
| 9,385,195 B1 | 7/2016 | Zhang |
| 9,412,788 B2 | 8/2016 | Yokoyama et al. |
| 9,450,075 B2 | 9/2016 | Huang |
| 9,627,476 B2 | 4/2017 | Diaz et al. |
| 9,640,531 B1 | 5/2017 | Or-Bach et al. |
| 9,786,783 B2 | 10/2017 | Hafez et al. |
| 9,818,856 B2 | 11/2017 | Hoshi et al. |
| 9,929,133 B2 | 3/2018 | Lin et al. |
| 10,128,257 B2 | 11/2018 | Pang et al. |
| 10,420,171 B2 | 9/2019 | Goktepeli |
| 10,790,281 B2 | 9/2020 | Mehandru et al. |
| 10,872,820 B2 | 12/2020 | Block et al. |
| 2001/0041407 A1 | 11/2001 | Brown |
| 2002/0119640 A1* | 8/2002 | Gonzalez ............ H01L 25/0657 438/455 |
| 2004/0119165 A1 | 6/2004 | Baukus et al. |
| 2005/0151276 A1 | 7/2005 | Jang et al. |
| 2005/0275017 A1* | 12/2005 | Pozder ................ H01L 27/1203 257/E27.026 |
| 2006/0115943 A1 | 6/2006 | Koyanagi |
| 2006/0246709 A1* | 11/2006 | Kim .................. H01L 21/76898 257/E21.597 |
| 2007/0001219 A1 | 1/2007 | Radosavljevic et al. |
| 2007/0001232 A1 | 1/2007 | King et al. |
| 2007/0181880 A1 | 8/2007 | Kim |
| 2007/0249130 A1 | 10/2007 | Anderson et al. |
| 2007/0296002 A1 | 12/2007 | Liang et al. |
| 2008/0061285 A1 | 3/2008 | Arghavani et al. |
| 2008/0179678 A1 | 7/2008 | Dyer et al. |
| 2008/0185648 A1* | 8/2008 | Jeong ..................... H10B 12/01 257/347 |
| 2008/0217665 A1 | 9/2008 | Chen et al. |
| 2009/0114955 A1 | 5/2009 | Stapelmann et al. |
| 2009/0152611 A1 | 6/2009 | Fujimoto |
| 2009/0166677 A1 | 7/2009 | Shibata et al. |
| 2011/0095289 A1* | 4/2011 | Sasaki ..................... H01L 21/56 257/773 |
| 2011/0193240 A1* | 8/2011 | Farooq ................ H01L 25/0657 228/199 |
| 2011/0241073 A1 | 10/2011 | Cohen et al. |
| 2012/0043663 A1 | 2/2012 | Ko et al. |
| 2012/0088339 A1 | 4/2012 | Molin et al. |
| 2012/0205727 A1* | 8/2012 | Kanakasabapathy ........................ H01L 29/66772 257/288 |
| 2012/0195539 A1 | 10/2012 | Shibata |
| 2013/0130479 A1 | 5/2013 | Stuber et al. |
| 2013/0134585 A1 | 5/2013 | Stuber et al. |
| 2013/0120887 A1 | 6/2013 | Okada et al. |
| 2013/0162346 A1 | 6/2013 | McElvain et al. |
| 2013/0193583 A1 | 8/2013 | Yi et al. |
| 2013/0241004 A1 | 9/2013 | Yin et al. |
| 2014/0054685 A1 | 2/2014 | Consentino et al. |
| 2014/0210058 A1 | 7/2014 | Lee et al. |
| 2014/0231874 A1 | 8/2014 | Hoshi et al. |
| 2014/0264485 A1* | 9/2014 | Li ....................... H01L 27/0924 257/288 |
| 2014/0264632 A1 | 9/2014 | Richter et al. |
| 2014/0332749 A1 | 11/2014 | Yokoyama |
| 2015/0028289 A1 | 1/2015 | Hekmatshoartabari |
| 2015/0054033 A1 | 2/2015 | Cheng et al. |
| 2015/0061020 A1 | 3/2015 | Yokoyama et al. |
| 2015/0061026 A1 | 3/2015 | Lin et al. |
| 2015/0069520 A1 | 3/2015 | Lee |
| 2015/0129891 A1 | 5/2015 | Lin et al. |
| 2015/0137224 A1 | 5/2015 | Meiser et al. |
| 2015/0137842 A1 | 5/2015 | Murakami et al. |
| 2015/0206936 A1 | 7/2015 | Huang |
| 2015/0235949 A1 | 8/2015 | Yu et al. |
| 2015/0280010 A1 | 10/2015 | Shieh et al. |
| 2015/0347659 A1 | 12/2015 | Chiang et al. |
| 2015/0348909 A1* | 12/2015 | Yamazaki ........... H01L 27/0688 257/775 |
| 2015/0348945 A1 | 12/2015 | Or-Bach et al. |
| 2015/0348997 A1 | 12/2015 | Sasagawa et al. |
| 2015/0357425 A1 | 12/2015 | Liu et al. |
| 2015/0380305 A1 | 12/2015 | Basker et al. |
| 2016/0043083 A1 | 2/2016 | Kawa et al. |
| 2016/0093629 A1 | 3/2016 | Wang |
| 2016/0095221 A1 | 3/2016 | Ramachandran et al. |
| 2016/0197069 A1 | 7/2016 | Morrow et al. |
| 2016/0247887 A1 | 8/2016 | Jun et al. |
| 2016/0307996 A1 | 10/2016 | Meiser et al. |
| 2016/0351492 A1 | 12/2016 | Watanabe et al. |
| 2017/0345829 A1 | 11/2017 | Balakrishnan et al. |
| 2018/0197895 A1 | 7/2018 | Liu |
| 2019/0057959 A1 | 2/2019 | Or-Bach et al. |
| 2020/0035560 A1 | 1/2020 | Block et al. |

FOREIGN PATENT DOCUMENTS

| | | |
|---|---|---|
| EP | 1624487 | 2/2006 |
| EP | 1638142 | 3/2006 |
| JP | H05198739 | 8/1993 |
| JP | H09260669 | 3/1997 |
| JP | 2002538465 | 11/2002 |
| JP | 2004311703 | 11/2004 |
| JP | 2008529012 | 7/2008 |
| JP | 2009295961 | 12/2009 |
| JP | 2014220376 | 11/2014 |
| JP | 2014170940 | 3/2017 |
| KR | 20070081025 | 8/2007 |
| KR | 1020100106702 | 10/2010 |
| TW | 201642474 | 12/2016 |
| TW | 201729423 | 8/2017 |
| WO | 2013004836 | 1/2013 |
| WO | 2013166116 | 11/2013 |
| WO | 2017052562 | 3/2017 |
| WO | 2017052626 | 3/2017 |
| WO | 2017095409 | 6/2017 |
| WO | 2018031175 | 2/2018 |

OTHER PUBLICATIONS

International Search Report and Written Opinion from PCT/US2017/068441 dated Sep. 21, 2018, 14 pgs.

Kang, Chang Yong, et al., "Effects of Film Stress Modulation Using TiN Metal Gate on Stress Engineering and Its Impact on Device

(56) References Cited

OTHER PUBLICATIONS

Characteristics in Metal Gate/High-k Dielectric SOI FinFETs", IEEE Electron Device Letters, vol. 29, No. 5, May 2008, 4pgs.

\* cited by examiner

STACKED TRANSISTORS WITH CONTACT LAST

CLAIM OF PRIORITY

This Application is a National Stage Entry of, and claims priority to, PCT Application No. PCT/US2017/068441, filed on Dec. 26, 2017 and titled "STACKED TRANSISTORS WITH CONTACT LAST", which is incorporated by reference in its entirety for all purposes.

BACKGROUND

In semiconductor devices, as more transistors are required to be integrated into smaller dimensions, attention has been focused on stacking transistors one on top of the other. While stacking of transistors has the potential to yield more highly integrated devices, the processing of subsequently formed transistors may expose the previously formed lower device layers to potentially harmful conditions. For example, a high temperature annealing process could produce damage to a previously formed feature, such as a metal contact. In part because of the very small dimensions of transistor metal contacts, any creeping or cracking damage could hinder the formation of a subsequent conductive connection. Poor metal connections between separate contacts can create an increased resistance that may ultimately cause a device to fail.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
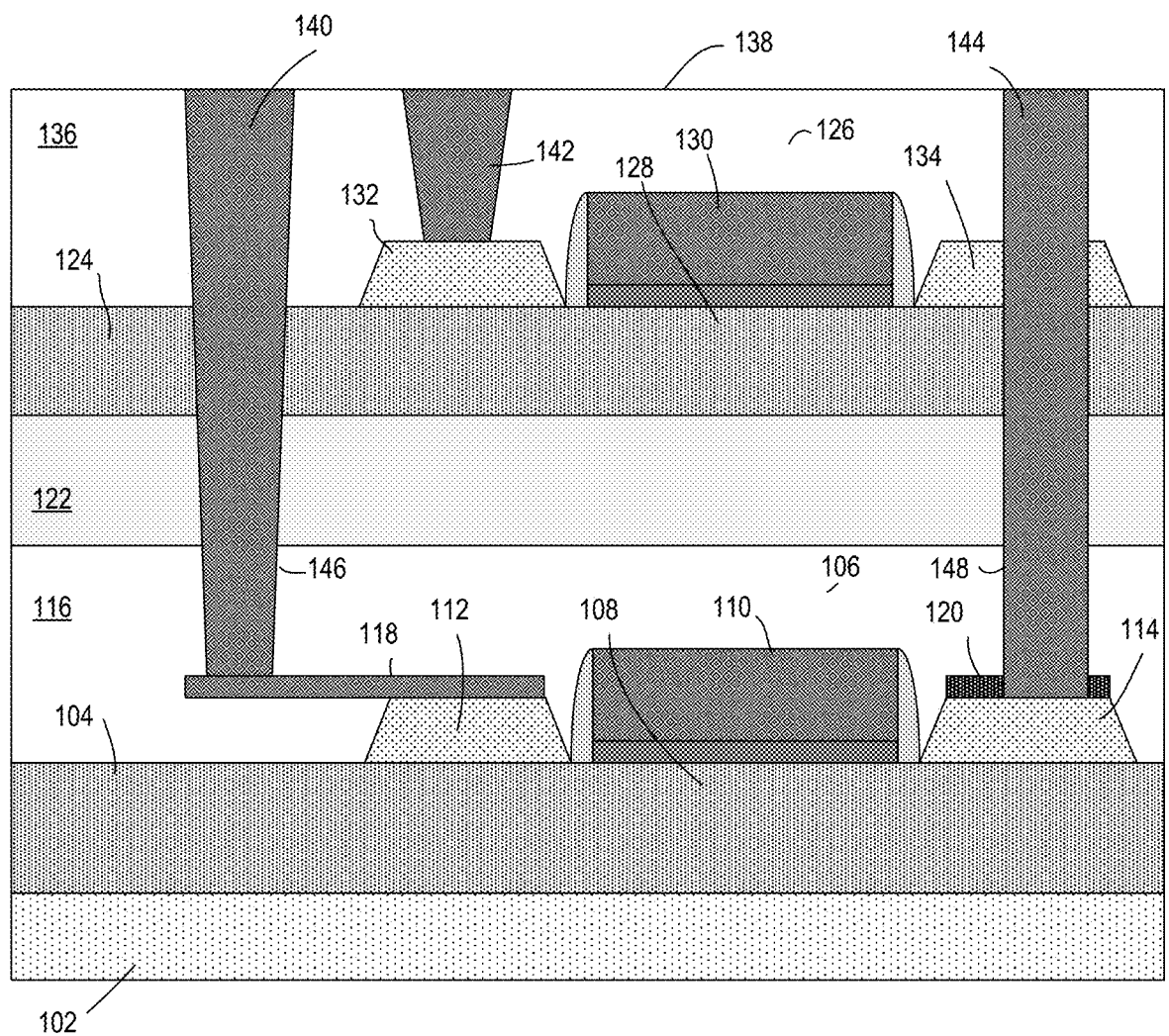
FIG. 1 illustrates a cross-sectional view of an example semiconductor device with stacked transistors with contact last, according to some embodiments.

Stacked transistors with contact last are generally presented. In this regard, embodiments of the present disclosure may enable high quality electrical contacts. The elimination of potentially poor conductive couplings between separate metal contacts formed independently may lead to lowered resistance in the electrical routing. One skilled in the art would appreciate that this approach may enable more highly integrated, lower energy semiconductor devices.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "to" "bottom," "over," "under," and the like in the description and in the claims, if any, are used for descriptive purposes and not necessarily for describing permanent relative positions.

FIG. 1 illustrates cross-sectional view of an example semiconductor device with stacked transistors with contact last, according to some embodiments. As shown, device 100 includes substrate 102, semiconductor layer 104, transistor 106, channel region 108, gate stack 110, source region 112, drain region 114, dielectric layer 116, wire 118, etchstop 120, bonding layer 122, semiconductor layer 124, transistor 126, channel region 128, gate stack 130, source region 132, drain region 134, dielectric layer 136, dielectric surface 138, contacts 140, 142, and 144, and contact sidewalls 146 and 148. While shown as including raised source/drain (RSD) transistors, in other embodiments, device 100 may include different topologies, such as FinFET transistors, or different devices, such as diodes.

In some embodiments, substrate 102 comprises at least one layer of undoped semiconductor, such as Ge, Si, SiGe, InGaAs, AlSb, etc. In some embodiments, semiconductor layer 104, which may include channel region 108, may be formed separately from substrate 102 and may contain different semiconductor materials, including, but not limited to, InGaAs, InAs, InGaAs, InGaAsSb, InSb, GaSb, Ge, or SiGe. Substrate 102 may be composed of one or more semiconductor material layers on top of another semiconductor material such as silicon.

When transistor 106 is in an active mode, channel region 108 may serve as a channel between source region 112 and drain region 114, located on opposite sides of channel region 108. In some embodiments, transistor 106 may be a PMOS or NMOS transistor and source region 112 and drain region 114 are p-doped or n-doped variants of the same semiconductor as channel region 108.

Gate stack 110, may include a gate dielectric, a gate region, and spacers on channel region 108. Gate stack 110 may include metal or polycrystalline silicon coupled with interconnects, not shown, to provide a voltage proximate to channel region 108 to place transistor 106 into an active mode. In some embodiments, gate stack 110 may include one or more layers of oxides and/or nitrides.

In some embodiments, wire 118 and etchstop 120 may be present as part of a process of creating a conductive contact with source region 112 and drain region 114, respectively, as shown in more detail hereinafter. In other embodiments, contacts, such as contact 140 or contact 144 may be formed directly on or within source region 112 and/or drain region 114.

Dielectric layer 116 may encapsulate transistor 106 and insulate electrical connections. In some embodiments, dielectric 116 may be an interlayer dielectric (ILD), such as silicon dioxide or another low-k dielectric. Dielectric layer 116 may be formed by any known method, such as chemical vapor deposition, for example.

Bonding layer 122 may be present, in some embodiments, to bond semiconductor layer 124 with dielectric layer 116. In some embodiments, semiconductor layer 124 may be epitaxially grown on a separate substrate and then transferred and bonded with dielectric layer 116 through bonding layer 122, which may be a polymer adhesive, for example. In other embodiments, bonding layer 122 may not be present and semiconductor layer 124 may be deposited over dielectric layer 116. In some embodiments, semiconductor layer 124 may be a same semiconductor material as semiconductor layer 104, while in other embodiments, semiconductor layer 124 may be a different semiconductor material than semiconductor material 104.

Transistor 126 may be the same as, or different from transistor 106. In some embodiments, device 100 may be a CMOS device and transistor 106 may be a NMOS transistor, while transistor 126 may be a PMOS transistor, or vice versa. In some embodiments, for example as shown, transistor 126 may be aligned with transistor 106, such that source region 132 and drain region 134 are directly over source region 112 and drain region 114, respectively. In other embodiments, transistor 126 may be offset from transistor 106.

In some embodiments, contacts 140, 142, and 144 may be formed through dielectric surface 138, and may be any metal or other conductive material, including, but not limited to, copper, tungsten, tantalum, titanium, aluminum, or palladium. In some embodiments, contact 140 may be formed through dielectric layer 136, semiconductor layer 124, bonding layer 122, and dielectric layer 116, contacting wire 118. Contact sidewall 146 may be straight. As used herein, a straight sidewall may have some curvature or roughness but without significant deviations at transitions between material layers, for example between bonding layer 122 and dielectric layer 116. In some embodiments, contact sidewall 146 may be sloped, such that contact 140 may have be wider at dielectric surface 138 than at wire 118. In some embodiments, contact 142 may contact on, or in some cases below, a surface of source region 132. In some embodiments, contact 144 may be formed through dielectric layer 136, drain region 134, semiconductor layer 124, bonding layer 122, dielectric layer 116, and etchstop 120, contacting drain region 114. In some embodiments, contact sidewall 148 may be orthogonal to dielectric surface 138 and contact 144 may have a substantially constant width, within about 10%, from dielectric surface 138 to drain region 114. While shown as coupling drain region 134 with drain region 114, in some embodiments drain region 114 and drain region 134 are isolated from each other.

FIGS. 2A-2F illustrate cross-sectional views of manufacturing steps of semiconductor devices with stacked transistors with contact last, according to some embodiments. FIGS. 2A-2F are not drawn to scale and a gate contact is not illustrated for enhanced clarity. Embodiments of FIGS. 2A-2F may include features previously described in reference to FIG. 1.

Figure 2A:
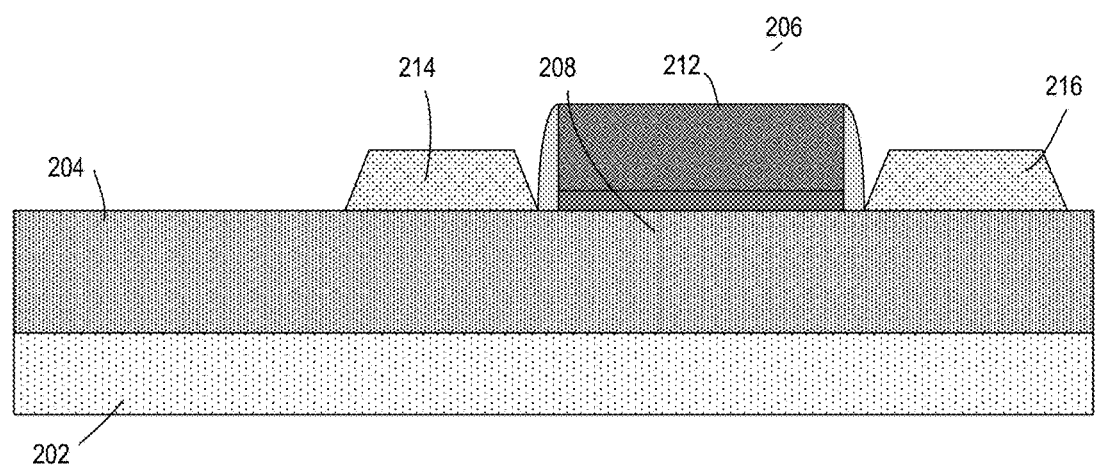
FIGS. 2A-2F illustrate cross-sectional views of manufacturing steps of semiconductor devices with stacked transistors with contact last, according to some embodiments.

As shown in FIG. 2A, assembly 200 includes substrate 202, semiconductor layer 204, transistor 206, channel region 208, gate stack 212, source region 214, and drain region 216. In some embodiments, substrate 202 may be undoped silicon, while semiconductor layer 204 may be doped (n-type or p-type) silicon, however, other semiconductor materials may be used. In some embodiments, source region 214 and drain region 216 may be epitaxially formed on semiconductor layer 204 by known deposition techniques, such as atomic layer deposition (ALD), for example. In some embodiments, gate stack 212 may be formed by either gate-first or gate-last processes.

Figure 2B:
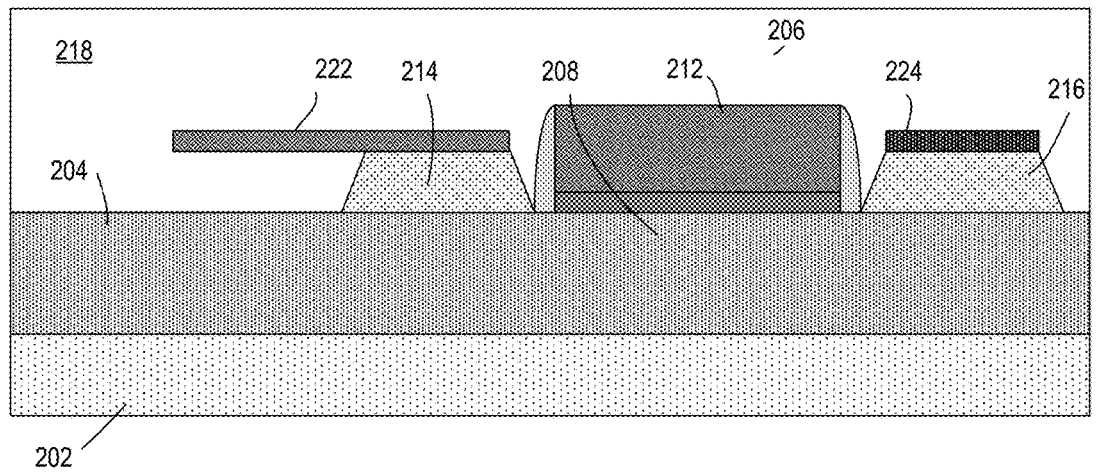

FIG. 2B shows assembly 210, which may include dielectric layer 218, wire 222, and etchstop 224. In some embodiments, wire 222, which may be copper or any other metal, may enable a contact formed through subsequent layers above to couple with source region 214. While shown as being formed over a top surface of source region 214, wire 222 may be formed in contact with a sidewall or other surface of source region 214, in some embodiments. Etchstop 224 may be chosen to stop a chemical etchant that might otherwise etch through drain region 216. In some embodiments, etchstop 224 may not be necessary, for example an etchant may be chosen such that it will stop on drain region 216, or laser etching may be used.

Figure 2C:
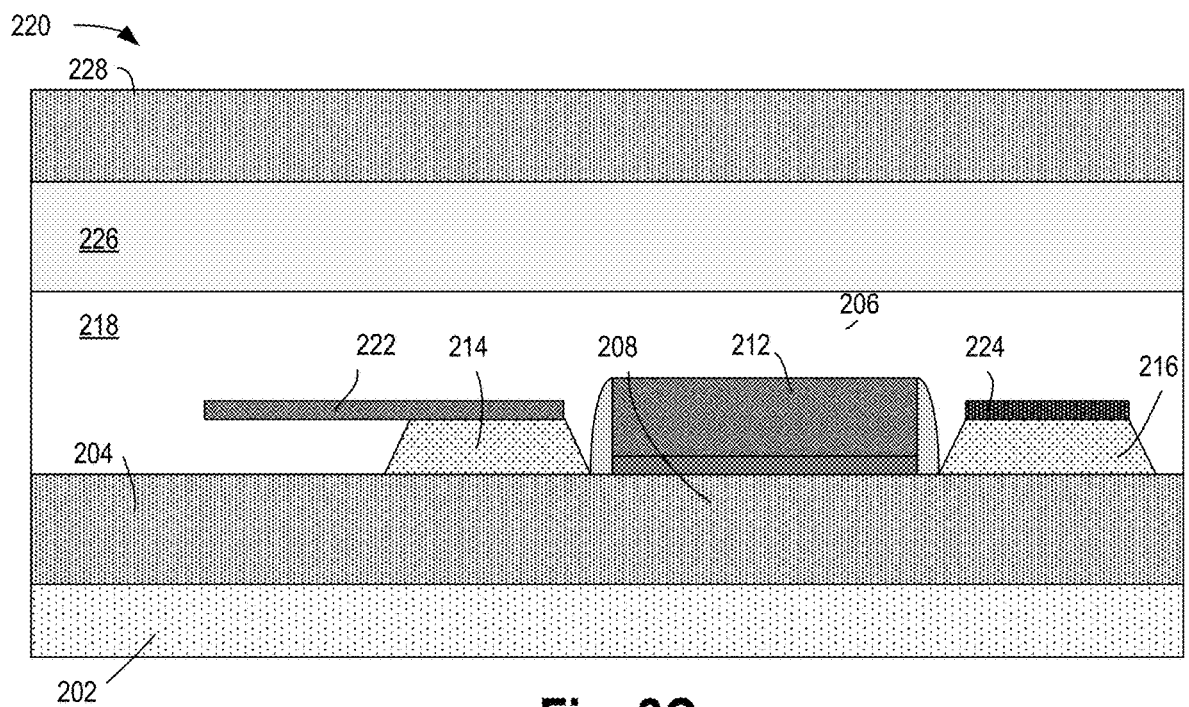

As shown in FIG. 2C, assembly 220 may include bonding layer 226 and semiconductor layer 228. In some embodiments, semiconductor layer 228 may have been transferred to assembly 220 as part of a blanket transfer process where semiconductor layer 228 was epitaxially formed on a separate substrate, separated from that substrate, and then adhered to dielectric layer 218 through bonding layer 226. In other embodiments, bonding layer 226 may not be necessary, for example if semiconductor layer 228 may be deposited directly over dielectric layer 218.

Figure 2D:
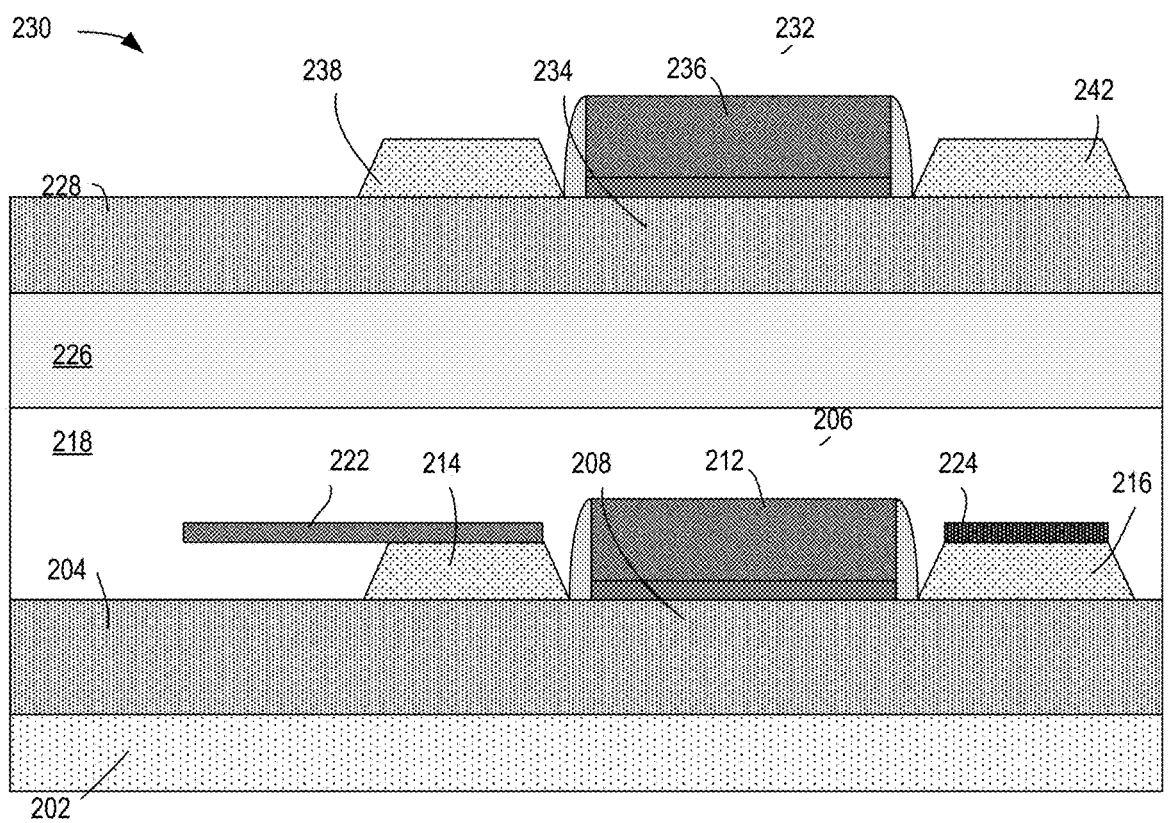

Turning now to FIG. 2D, assembly 230 may include transistor 232 including channel region 234, gate stack 236, source region 238, and drain region 242. In some embodiments, source region 238 and drain region 242 may be heavily doped with a p-type dopant, such as boron or the like, or an n-type dopant, such as phosphorus or arsenic or the like. In some embodiments, gate stack 236 may include a high-k gate dielectric adjacent to channel region 234.

Figure 2E:
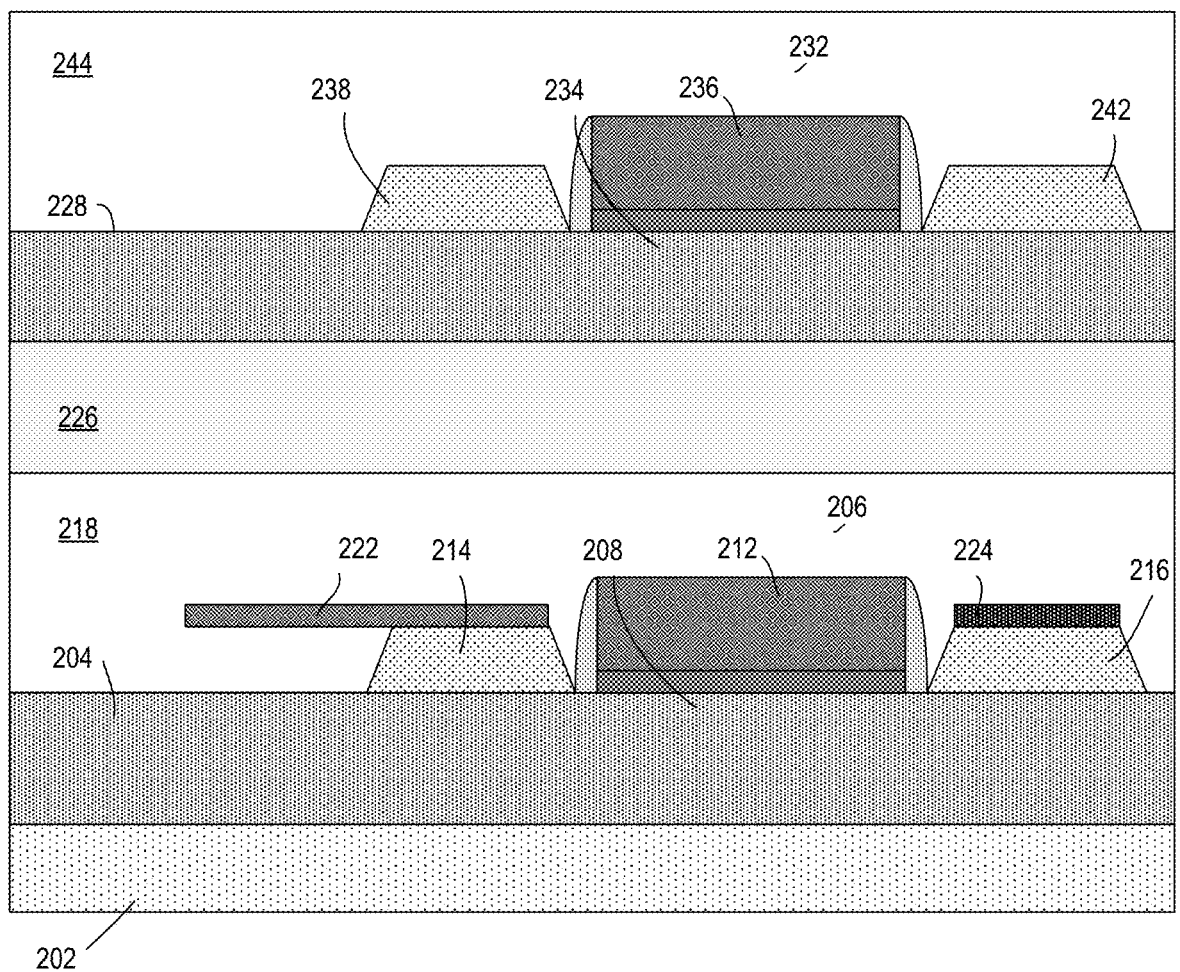

FIG. 2E shows assembly 240, which may have dielectric layer 244 formed over semiconductor layer 228 and transistor 232. In some embodiments, dielectric layer 244 may be a form of silicon dioxide or the like to provide insulation to conductive materials and to be further etched for the formation of interconnects.

Figure 2F:
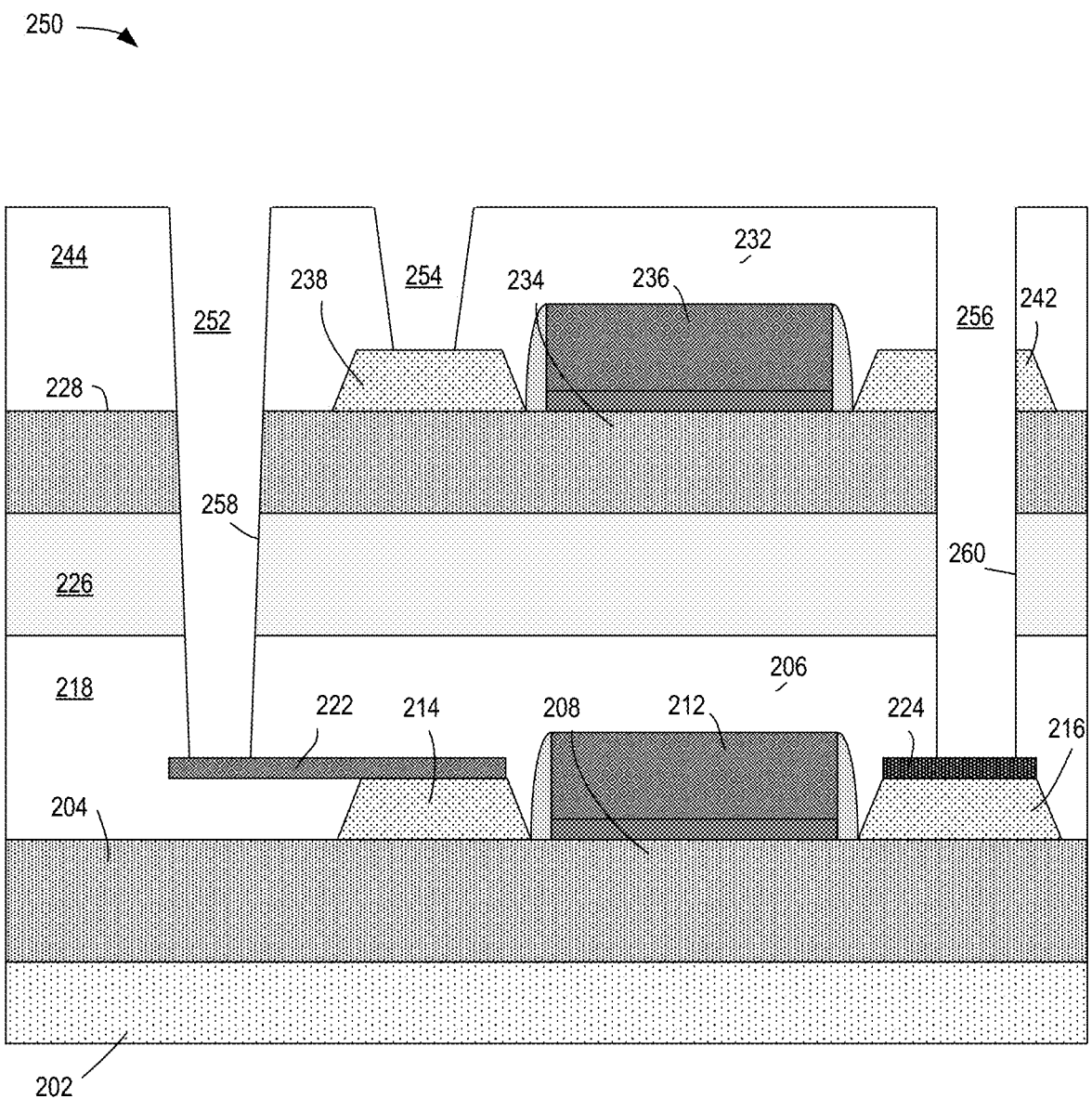

As shown in FIG. 2F, assembly 250 may include openings 252, 254, and 256, and opening sidewalls 258 and 260. In some embodiments, openings 252, 254, and 256 may be formed by one or more suitable formation techniques, including, but not limited to chemical etching or laser etching. In some embodiments, a laser, for example a $CO_2$ laser may form opening 252 with sloped sidewall 258 by ablating through dielectric layer 244, semiconductor layer 228, bonding layer 226, and dielectric layer 218, before stopping on metal wire 222. In some embodiments, a chemical etchant, for example an anisotropic etchant, may form opening 256 with vertical sidewall 260 by etching through dielectric layer 244, drain region 252, semiconductor layer 228, bonding layer 226, and dielectric layer 218, before stopping on etchstop 224. At least a portion of etchstop 224 may then be selectively etched to expose drain region 216 for metal deposition. In some embodiments, metal deposition by any suitable technique may fill openings 252, 254, and 256 to create a device, such as device 100.

Figure 3A:
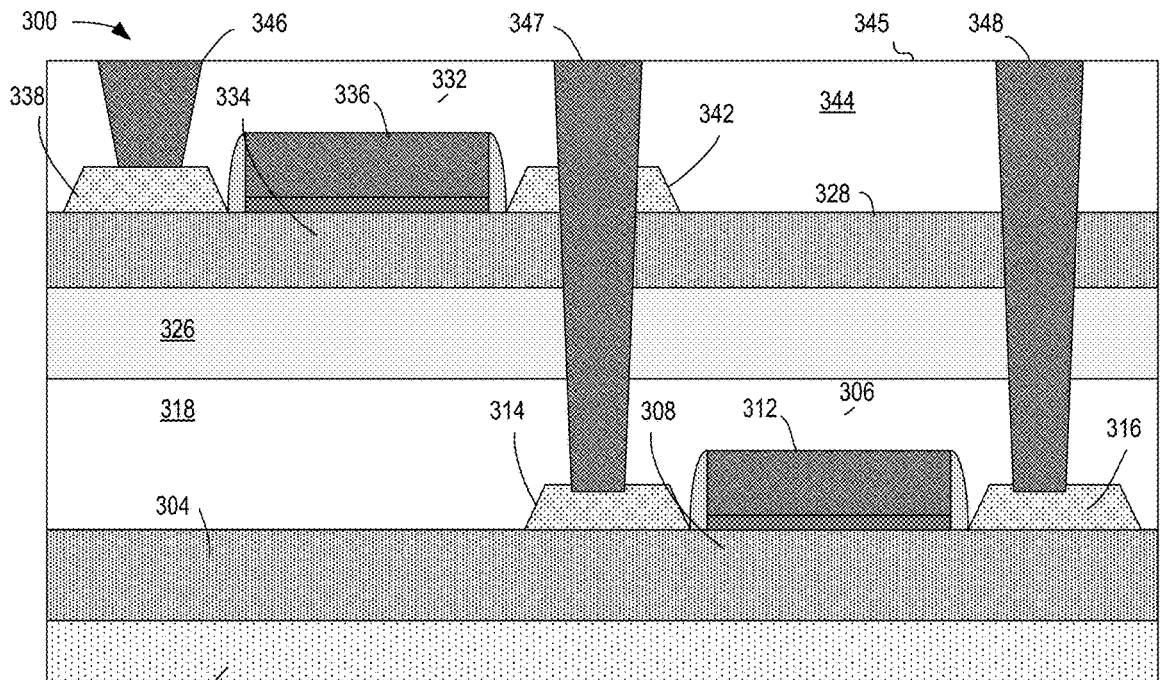
FIGS. 3A & 3B illustrate cross-sectional views of other example semiconductor devices with stacked transistors with contact last, according to some embodiments.
Figure 3B:
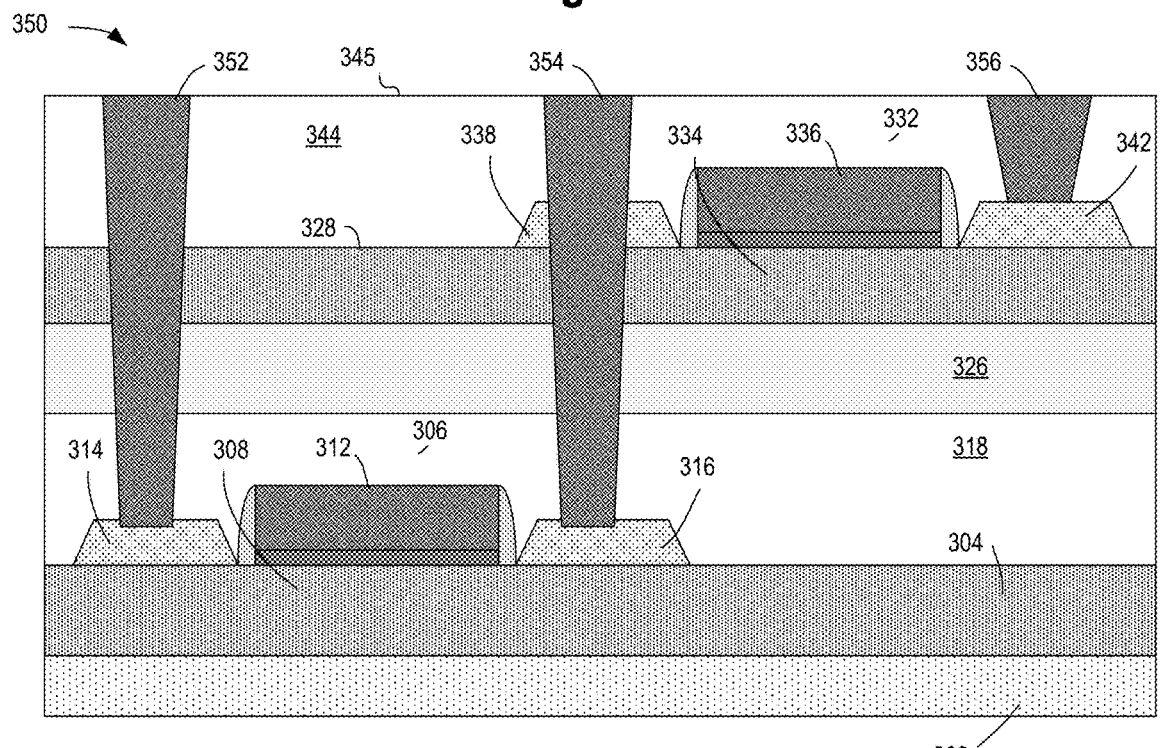

FIGS. 3A & 3B illustrate cross-sectional views of other example semiconductor devices with stacked transistors with contact last, according to some embodiments. FIGS. 3A & 3B may represent alternative embodiments of device 100 having regions of an upper transistor aligned differently relative to the bottom transistor. While two examples are shown, it would be appreciated by one skilled in the art that other transistor alignments or configurations would be possible that could implement contacts as described herein. Devices 300 and/or 350 depicted in FIGS. 3A & 3B may include materials or features previously mentioned in reference to other embodiments.

As shown in FIG. 3A, device 300 includes substrate 302, semiconductor layer 304, transistor 306, channel region 308, gate stack 312, source region 314, drain region 316, dielectric layer 318, bonding layer 326, semiconductor layer 328, transistor 332, channel region 334, gate stack 336, source region 338, drain region 342, dielectric layer 344, dielectric surface 345, and contacts 346, 347, and 348. In some embodiments, device 300 may represent a CMOS device that may include drain region 342 of transistor 332 coupled with source region 314 of transistor 306, where transistor 306 may be a NMOS transistor and transistor 332 may be a PMOS transistor, for example.

FIG. 3B shows device 350, which may include contacts 352, 354, and 356. In some embodiments, device 350 may represent a CMOS device that may include drain region 316 of transistor 306 coupled with source region 338 of transistor 332, where transistor 306 may be a NMOS transistor and transistor 332 may be a PMOS transistor, for example. In some embodiments, metal contacts 352 or 354 may extend below a surface of source region 314 or drain region 316, respectively.

Figure 4:
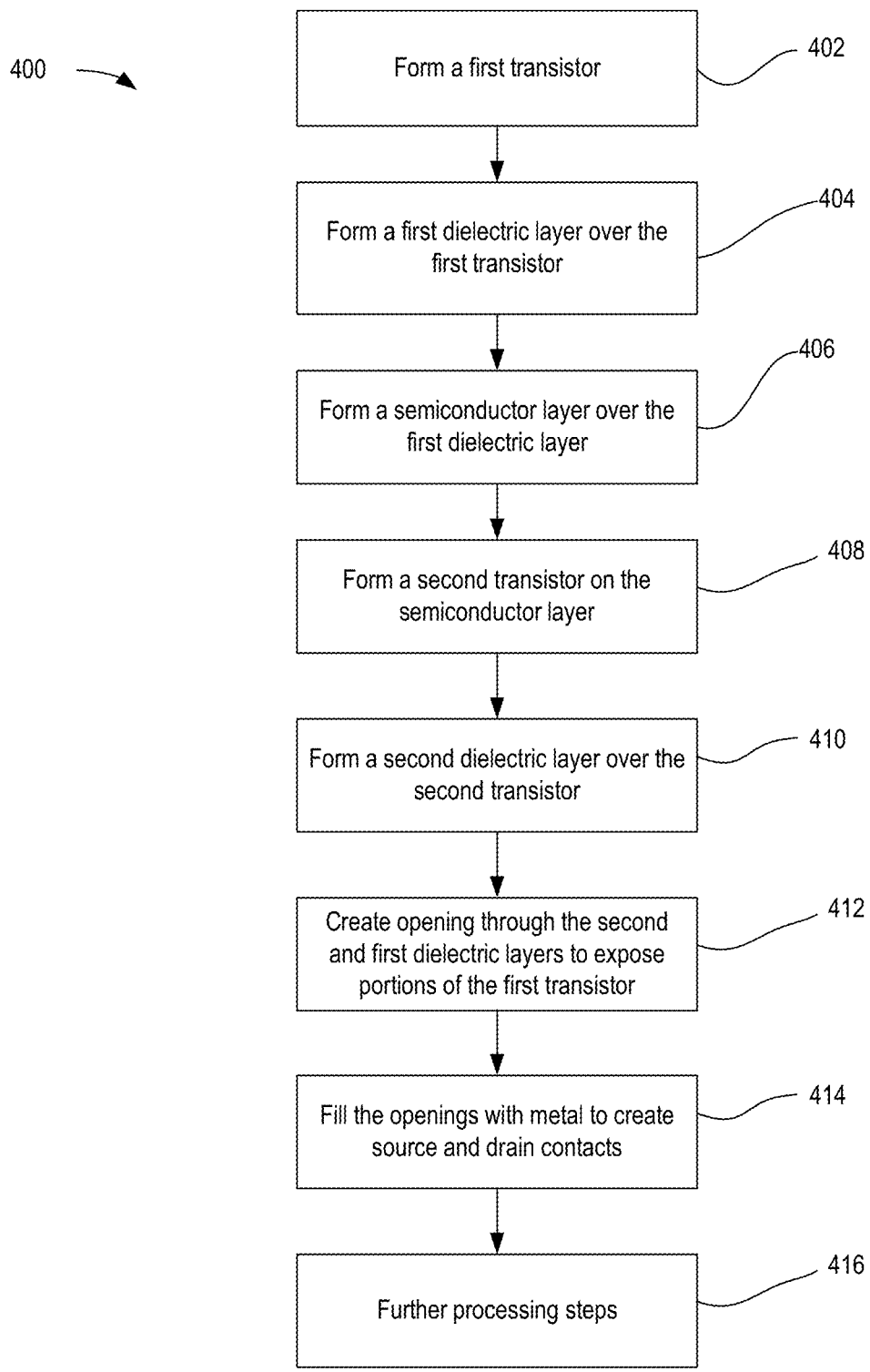
FIG. 4 illustrates a flowchart of a method of forming a semiconductor device with stacked transistors with contact last, in accordance with some embodiments.

FIG. 4 illustrates a flowchart of a method of forming a semiconductor device with stacked transistors with contact last, in accordance with some embodiments. Although the blocks in the flowchart with reference to FIG. 4 are shown in a particular order, the order of the actions can be modified. Thus, the illustrated embodiments can be performed in a different order, and some actions/blocks may be performed in parallel. Some of the blocks and/or operations listed in FIG. 4 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 400 begins with forming (402) a first transistor. In some embodiments, a first transistor may be formed by epitaxial growth or regrowth of source and drain regions on a semiconductor layer. In some embodiments, metal wires or etchstop layers may be formed in contact with the source and/or drain regions. Next, a first dielectric layer is formed (404) over the first transistor. In some embodiments, interlayer dielectric, for example dielectric 116, may be deposited over transistor 106, by atomic layer deposition or another suitable deposition process.

Then, a semiconductor layer may be formed (406) over the first dielectric layer. In some embodiments, a semiconductor layer may be transferred and bonded with the dielectric layer. In other embodiments, the semiconductor layer may be deposited onto the dielectric layer by any suitable deposition technique. Next, a second transistor may be formed (408) on the semiconductor layer. In some embodiments, the second transistor may be aligned directly over the first transistor such a source region and a drain region of the second transistor are directly over a source region and a drain region of the first transistor. In other embodiments, the second transistor may be offset from the first transistor into a different alignment or no alignment at all.

The method continues with forming (410) a second dielectric layer over the second transistor. In some embodiments, the second dielectric layer may be the same material as the first dielectric layer. Next, openings may be created (412) through the second and first dielectric layers (and other intervening layers) to expose portions of the first transistor. In some embodiments, laser drilling may expose a source or drain region, or a metal in contact with the source or drain region, of the first (lower) transistor. In some embodiments, chemical etching may expose a source or drain region, or an etchstop in contact with the source or drain region, of the first (lower) transistor.

Then the openings may be filled (414) with metal to create source and drain contacts with the first transistor. In some embodiments, to the extent an etchstop was present, the etchstop may be removed prior to metal plating of the openings. Finally, further processing steps (416) may be performed to form the semiconductor device. In some embodiments, gate contacts and further interconnect layers are formed.

Figure 5:
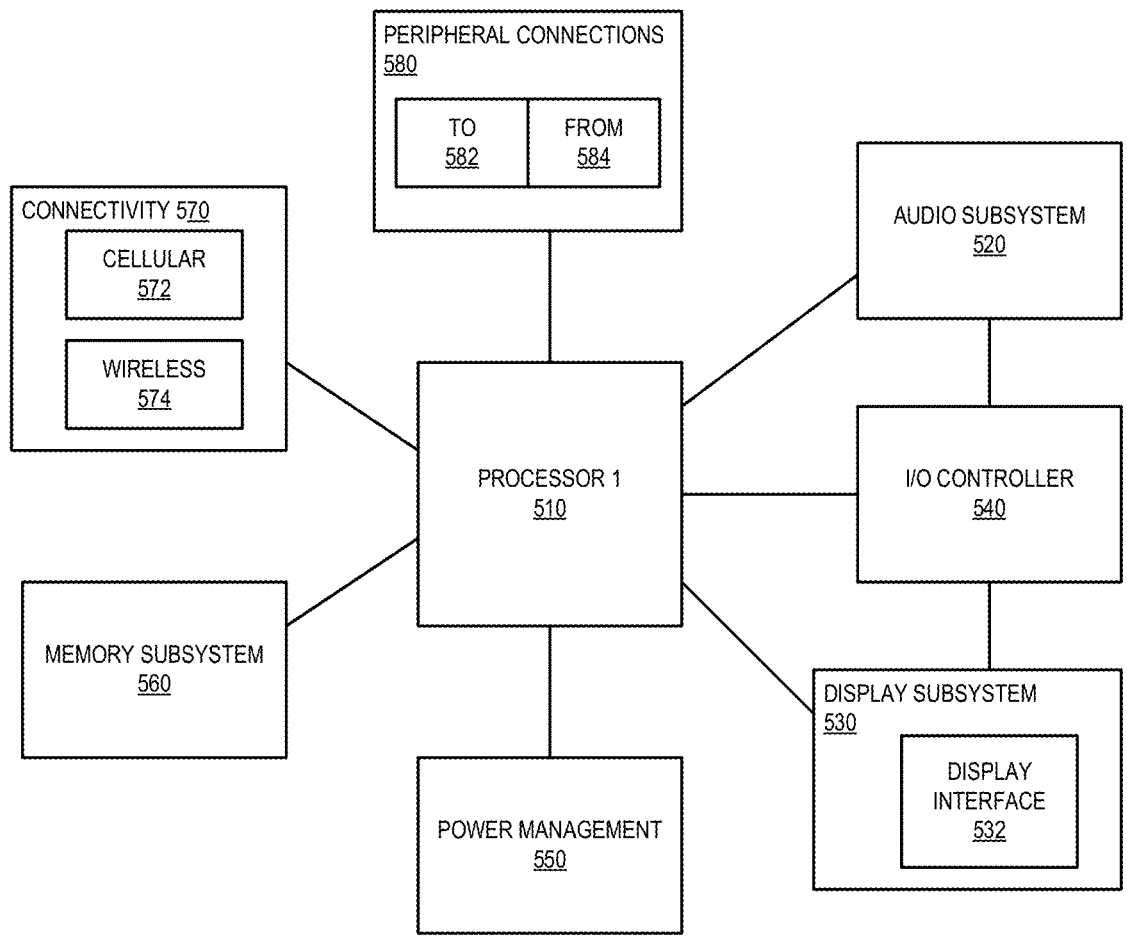
FIG. 5 illustrates a smart device or a computer system or a SoC (System-on-Chip) which includes a semiconductor device with stacked transistors with contact last, according to some embodiments.

FIG. 5 illustrates a smart device or a computer system or a SoC (System-on-Chip) 500 which includes a semiconductor device stacked transistors with contact last, according to some embodiments. In some embodiments, computing device 500 represents a mobile computing device, such as a computing tablet, a mobile phone or smart-phone, a wireless-enabled e-reader, or other wireless mobile device. It will be understood that certain components are shown generally, and not all components of such a device are shown in computing device 500. In some embodiments, one or more components of computing device 500, for example processor 510 and/or memory subsystem 560, include a semiconductor device with stacked transistors with contact last as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors—BJT PNP/NPN, BiCMOS, CMOS, etc., may be used without departing from the scope of the disclosure.

In some embodiments, computing device 500 includes a first processor 510. The various embodiments of the present disclosure may also comprise a network interface within 570 such as a wireless interface so that a system embodiment may be incorporated into a wireless device, for example, cell phone or personal digital assistant.

In one embodiment, processor 510 can include one or more physical devices, such as microprocessors, application processors, microcontrollers, programmable logic devices, or other processing means. The processing operations performed by processor 510 include the execution of an operating platform or operating system on which applications and/or device functions are executed. The processing operations include operations related to I/O (input/output) with a human user or with other devices, operations related to power management, and/or operations related to connecting the computing device 500 to another device. The processing operations may also include operations related to audio I/O and/or display I/O.

In one embodiment, computing device 500 includes audio subsystem 520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 500, or connected to the computing device 500. In one embodiment, a user interacts with the computing device 500 by providing audio commands that are received and processed by processor 510.

Display subsystem 530 represents hardware (e.g., display devices) and software (e.g., drivers) components that provide a visual and/or tactile display for a user to interact with the computing device 500. Display subsystem 530 includes display interface 532, which includes the particular screen or hardware device used to provide a display to a user. In one embodiment, display interface 532 includes logic separate from processor 510 to perform at least some processing related to the display. In one embodiment, display subsystem 530 includes a touch screen (or touch pad) device that provides both output and input to a user.

I/O controller 540 represents hardware devices and software components related to interaction with a user. I/O controller 540 is operable to manage hardware that is part of audio subsystem 520 and/or display subsystem 530. Additionally, I/O controller 540 illustrates a connection point for additional devices that connect to computing device 500 through which a user might interact with the system. For example, devices that can be attached to the computing device 500 might include microphone devices, speaker or stereo systems, video systems or other display devices, keyboard or keypad devices, or other I/O devices for use with specific applications such as card readers or other devices.

As mentioned above, I/O controller 540 can interact with audio subsystem 520 and/or display subsystem 530. For example, input through a microphone or other audio device can provide input or commands for one or more applications or functions of the computing device 500. Additionally, audio output can be provided instead of, or in addition to display output. In another example, if display subsystem 530 includes a touch screen, the display device also acts as an input device, which can be at least partially managed by I/O controller 540. There can also be additional buttons or switches on the computing device 500 to provide I/O functions managed by I/O controller 540.

In one embodiment, I/O controller 540 manages devices such as accelerometers, cameras, light sensors or other environmental sensors, or other hardware that can be included in the computing device 500. The input can be part of direct user interaction, as well as providing environmental input to the system to influence its operations (such as filtering for noise, adjusting displays for brightness detection, applying a flash for a camera, or other features).

In one embodiment, computing device 500 includes power management 550 that manages battery power usage, charging of the battery, and features related to power saving operation. Memory subsystem 560 includes memory devices for storing information in computing device 500. Memory can include nonvolatile (state does not change if power to the memory device is interrupted) and/or volatile (state is indeterminate if power to the memory device is interrupted) memory devices. Memory subsystem 560 can store application data, user data, music, photos, documents, or other data, as well as system data (whether long-term or temporary) related to the execution of the applications and functions of the computing device 500.

Elements of embodiments are also provided as a machine-readable medium (e.g., memory 560) for storing the computer-executable instructions. The machine-readable medium (e.g., memory 560) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 570 includes hardware devices (e.g., wireless and/or wired connectors and communication hardware) and software components (e.g., drivers, protocol stacks) to enable the computing device 500 to communicate with external devices. The computing device 500 could be separate devices, such as other computing devices, wireless access points or base stations, as well as peripherals such as headsets, printers, or other devices.

Connectivity 570 can include multiple different types of connectivity. To generalize, the computing device 500 is illustrated with cellular connectivity 572 and wireless connectivity 574. Cellular connectivity 572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 574 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 580 include hardware interfaces and connectors, as well as software components (e.g., drivers, protocol stacks) to make peripheral connections. It will be understood that the computing device 500 could both be a peripheral device ("to" 582) to other computing devices, as well as have peripheral devices ("from" 584) connected to it. The computing device 500 commonly has a "docking" connector to connect to other computing devices for purposes such as managing (e.g., downloading and/or uploading, changing, synchronizing) content on computing device 500. Additionally, a docking connector can allow computing device 500 to connect to certain peripherals that allow the computing device 500 to control content output, for example, to audiovisual or other systems.

In addition to a proprietary docking connector or other proprietary connection hardware, the computing device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an integrated circuit device structure is provided comprising: a first transistor comprising a source region and a drain region with a channel region therebetween; a first dielectric layer over the first transistor; a second transistor comprising a source region and a drain region with a channel region therebetween, wherein the second transistor is over the first dielectric layer; a second dielectric layer over the second transistor; and a contact coupled to the source region or the drain region of the first transistor, wherein the contact comprises a metal having a sidewall that extends through both the first and second dielectric layers.

In some embodiments, the contact comprises a sloped sidewall and wherein a first width of the contact within the second dielectric layer is greater than a second width of the contact within the first dielectric layer. In some embodiments, the contact is on the source region or the drain region of the first transistor. In some embodiments, the contact is on a metal coupled with the source region or the drain region of the first transistor. In some embodiments, the contact is on a sidewall of the source region or the drain region of the second transistor and on the source region or the drain region of the first transistor. In some embodiments, the contact extends through the source region or the drain region of the second transistor. In some embodiments, the contact is a first contact, the first contact is coupled with the source region of the first transistor, the integrated circuit device structure further comprising a second contact coupled with the drain region of the first transistor, wherein the second contact extends through both the first and second dielectric layers. Some embodiments also include a third contact coupled with the source region of the second transistor. In some embodiments, the first transistor comprises a PMOS transistor and the second transistor comprises a NMOS transistor. Some embodiments also include a bonding layer between the first dielectric layer and the second transistor. In some embodiments, the metal comprises at least one of copper, titanium, tantalum, aluminum, or palladium.

In another example, a system is provided comprising: a display subsystem; a wireless communication interface; and an integrated circuit device, the integrated circuit device comprising: a first transistor comprising a source region and a drain region with a channel region therebetween; a first dielectric layer over the first transistor; a second transistor comprising a source region and a drain region with a channel region therebetween, wherein the second transistor is over the first dielectric layer; a second dielectric layer over the second transistor; and a contact coupled with the source region of the first transistor, wherein the contact comprises a straight sidewall that extends from an upper surface of the second dielectric layer to within the first dielectric layer.

In some embodiments, the contact comprises a sloped sidewall and wherein a first width of the contact in second dielectric layer is greater than a second width of the contact in the first dielectric layer. In some embodiments, the contact is on the source region of the first transistor. In some embodiments, the contact is on a metal coupled with the source region of the first transistor. In some embodiments, the contact extends through the source region or the drain region of the second transistor. In some embodiments, the contact comprises a first contact, and further comprising a second contact coupled with the drain region of the first transistor. Some embodiments also include a bonding layer between the first dielectric layer and the second transistor. In some embodiments, the first transistor comprises a PMOS transistor and the second transistor comprises a NMOS transistor.

In another example, a method of forming an integrated circuit device structure is provided comprising: forming a first transistor; forming a first dielectric layer over the first transistor; forming a second transistor over the first dielectric layer; forming a second dielectric layer over the second transistor; and forming a contact coupled with a source region or a drain region of the first transistor, wherein the contact comprises a straight sidewall that extends from within the second dielectric layer to within the first dielectric layer.

In some embodiments, forming the contact comprises: anisotropically etching an opening through the second dielectric layer and the first dielectric layer to expose an etch stop layer over a source or a drain of the first transistor; removing the etch stop layer; and filling the opening with metal. In some embodiments, forming the contact comprises: laser drilling an opening through the second dielectric layer and the first dielectric layer to expose a metal coupled with a source or a drain of the first transistor; and filling the opening with metal. In some embodiments, forming the contact comprises: creating an opening through the second dielectric layer, a source or a drain of the second transistor, and the first dielectric layer, to expose a source or a drain of the first transistor; and filling the opening with metal. Some embodiments also include forming a second contact coupled with the source region or the drain region of the first transistor, wherein the second contact comprises a straight sidewall that extends from an upper surface of the second dielectric layer to within the first dielectric layer. In some embodiments, forming the second transistor comprises depositing a bonding material over the first dielectric layer and transferring the second transistor into contact with the bonding material.

In another example, an integrated circuit device package is provided comprising: a package substrate; and an integrated circuit device, the integrated circuit device comprising: a first transistor comprising a source region and a drain region with a channel region therebetween; a first dielectric layer over the first transistor; a second transistor comprising a source region and a drain region with a channel region therebetween, wherein the second transistor is over the first dielectric layer; a second dielectric layer over the second transistor; and a contact coupled to the source region or the drain region of the first transistor, wherein the contact comprises a metal having a straight sidewall that extends through both the first and second dielectric layers.

In some embodiments, the contact comprises a sloped sidewall and wherein a first width of the contact within the second dielectric layer is greater than a second width of the contact within the first dielectric layer. In some embodiments, the contact is on the source region or the drain region of the first transistor. In some embodiments, the contact is on a metal coupled with the source region or the drain region of the first transistor. In some embodiments, the contact is on a sidewall of the source region or the drain region of the second transistor and on the source region or the drain region of the first transistor. In some embodiments, the contact extends through the source region or the drain region of the second transistor. In some embodiments, the contact is a first contact, the first contact is coupled with the source region of the first transistor, the integrated circuit device structure further comprising a second contact coupled with the drain region of the first transistor, wherein the second contact extends through both the first and second dielectric layers. In some embodiments, the first transistor comprises a PMOS transistor and the second transistor comprises a NMOS transistor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A method of forming an integrated circuit device structure comprising:
   forming a first transistor;
   forming a first dielectric layer over the first transistor;
   forming a bonding layer over the first dielectric layer;
   affixing a semiconductor layer to the bonding layer;
   forming a second transistor comprising a channel portion of the semiconductor layer;
   forming a second dielectric layer over the second transistor;
   forming a first contact coupled with a source region or a drain region of the first transistor, wherein forming the first contact comprises forming an opening with a continuous sidewall that extends through the second dielectric layer, through the semiconductor layer, and through a thickness of the bonding layer that surrounds the first contact, to within the first dielectric layer, and lands upon a top surface of the source region or the drain region of the first transistor;
   forming a second contact coupled with a source region or a drain region of the second transistor, wherein forming the second contact comprises forming a second opening with a continuous sidewall that extends through the second dielectric layer and lands upon a top surface of the source region or the drain region of the first transistor;
   depositing metal concurrently into the first and second openings, the metal directly contacting the source region or the drain region of both the first and second transistors; and
   planarizing a top surface of the metal within the first contact to be substantially coplanar with a top surface of the metal within the second contact.

2. The method of claim 1, wherein forming the first contact comprises:
   laser drilling the opening through the second dielectric layer and the first dielectric layer; and
   filling the opening with the metal.

3. The method of claim 1, wherein forming the first contact comprises:
   creating the opening laterally spaced apart from a source or a drain of the second transistor; and
   filling the opening with the metal.

4. The method of claim 1, further comprising forming a third contact in direct contact with the source region or the drain region of both the first transistor and the second transistor, wherein the third contact comprises a continuous sidewall that extends from an upper surface of the second dielectric layer, through the source region or the drain region of the second transistor, through the semiconductor layer, through the bonding layer, and to within the first dielectric layer.

5. The method of claim 1, wherein the first transistor is a PMOS transistor and the second transistor is an NMOS transistor.

6. The method of claim 1, wherein forming the first contact comprises:
anisotropically etching the first opening through the second dielectric layer and the first dielectric layer to expose an etch stop layer over a source or a drain of the first transistor;
removing the etch stop layer; and
filling the opening with metal.

7. The method of claim 1, wherein forming the second transistor comprises transferring the second transistor along with the semiconductor layer.

8. A method of forming an integrated circuit device structure comprising:
receiving a workpiece comprising a first dielectric layer over a first transistor;
affixing a semiconductor layer to the workpiece with a bonding layer;
forming a second transistor comprising a channel portion of the semiconductor layer;
forming a second dielectric layer over the second transistor;
forming a first contact coupled with a source region or a drain region of the first transistor, wherein forming the first contact comprises forming an opening with a continuous sidewall that extends through the second dielectric layer, through the semiconductor layer, and through a thickness of the bonding layer that surrounds the first contact, to within the first dielectric layer, and lands upon a top surface of the source region or the drain region of the first transistor;
forming a second contact coupled with a source region or a drain region of the second transistor, wherein forming the second contact comprises forming a second opening with a continuous sidewall that extends through the second dielectric layer and lands upon a top surface of the source region or the drain region of the first transistor;
depositing metal into the first and second openings, the metal directly contacting the source region or the drain region of both the first and second transistors; and
planarizing a top surface of the metal within the first contact to be substantially coplanar with a top surface of the metal within the second contact.

9. The method of claim 8, wherein forming the first contact comprises:
laser drilling the opening through the second dielectric layer and the first dielectric layer; and
filling the opening with the metal.

10. The method of claim 8, wherein forming the first contact comprises:
creating the opening laterally spaced apart from a source or a drain of the second transistor; and
filling the opening with the metal.

11. The method of claim 8, further comprising forming a third contact in direct contact with the source region or the drain region of both the first transistor and the second transistor, wherein the third contact comprises a continuous sidewall that extends from an upper surface of the second dielectric layer, through the source region or the drain region of the second transistor, through the semiconductor layer, through the bonding layer, and to within the first dielectric layer.

12. The method of claim 8, wherein the first transistor is a PMOS transistor and the second transistor is an NMOS transistor.

13. The method of claim 8, wherein forming the first contact comprises:
anisotropically etching the first opening through the second dielectric layer and the first dielectric layer to expose an etch stop layer over a source or a drain of the first transistor;
removing the etch stop layer; and
filling the opening with metal.

14. The method of claim 8, wherein forming the second transistor comprises transferring the second transistor along with the semiconductor layer.

* * * * *